(12) United States Patent
Ljungberg

(10) Patent No.: US 7,655,293 B2
(45) Date of Patent: Feb. 2, 2010

(54) COATED CUTTING TOOL INSERT

(75) Inventor: Björn Ljungberg, Enskede (SE)

(73) Assignee: Sandvik Intellectual Property AB, Sandviken (SE)

( * ) Notice: Subject to any disclaimer, the term of this patent is extended or adjusted under 35 U.S.C. 154(b) by 502 days.

(21) Appl. No.: 11/359,748

(22) Filed: Feb. 23, 2006

(65) Prior Publication Data
US 2006/0204757 A1    Sep. 14, 2006

(30) Foreign Application Priority Data
Feb. 25, 2005    (SE) .................................... 0500435

(51) Int. Cl.
*B32B 9/00* (2006.01)

(52) U.S. Cl. .......................... 428/216; 51/307; 51/309; 407/119; 428/336; 428/698; 428/701; 428/702

(58) Field of Classification Search .................. 51/307, 51/309; 428/216, 336, 698, 701, 702; 407/119
See application file for complete search history.

(56) References Cited

U.S. PATENT DOCUMENTS 5,487,625 A * 1/1996 Ljungberg et al. .......... 407/119
5,851,687 A * 12/1998 Ljungberg ................... 428/698
5,861,210 A    1/1999 Lenander et al.
5,863,640 A    1/1999 Ljungberg et al.
6,015,614 A    1/2000 Ruppi
6,333,098 B1 * 12/2001 Olsson et al. ............... 428/698
6,884,496 B2   4/2005 Westphal et al.
7,163,735 B2 * 1/2007 Ruppi ......................... 428/216
7,306,636 B2 * 12/2007 Ljungberg ................... 51/307
7,416,778 B2 * 8/2008 Westergren et al. ......... 428/216

FOREIGN PATENT DOCUMENTS

EP    0 603 144 A1    12/1993
EP    0659903 B1      8/1998
EP    1 464 727 A2   10/2004

OTHER PUBLICATIONS

Ismail C. Noyan et al. "Residual Stress, Measurement by Diffraction and Interpretation." pp. 117-130. Jun. 2000.

* cited by examiner

*Primary Examiner*—Archene Turner
(74) *Attorney, Agent, or Firm*—Drinker Biddle & Reath LLP

(57) ABSTRACT

A CVD-coated cutting tool insert with a $TiC_xN_y$-layer with a low tensile stress level of 10-300 MPa and an $\alpha$-$Al_2O_3$-layer with a high surface smoothness of <0.1 μm as measured by AFM-technique is disclosed. This is obtained by subjecting the coating to a first intensive wet blasting operation with a slurry of F80 grits of $Al_2O_3$ followed by a second wet blasting treatment with a slurry of F320 grits of $Al_2O_3$.

7 Claims, 1 Drawing Sheet

COATED CUTTING TOOL INSERT

BACKGROUND OF THE INVENTION

The present invention relates to a CVD coated cutting tool insert suitable for machining of metals by turning, milling, drilling or by similar chip forming machining methods. The coated tool insert shows improved toughness behavior when used in interrupted cutting operations.

Modern high productivity chip forming machining of metals requires reliable tool inserts with high wear resistance, good toughness properties and excellent resistance to plastic deformation.

This has been achieved so far by employing a cemented carbide insert coated with a wear resistant coating. The cemented carbide insert is generally in the shape of an indexable insert clamped in a tool holder, but can also be in the form of a solid carbide drill or a milling cutter. Cemented carbide cutting tool inserts coated with various types of hard layers like TiC, $TiC_xN_y$, TiN, $TiC_xN_yO_z$ and $Al_2O_3$ have been commercially available for many years. Several hard layers in a multilayer structure generally build up such coatings. The sequence and the thickness of the individual layers are carefully chosen to suit different cutting application areas and work-piece materials.

The coatings are most frequently deposited by Chemical Vapor Deposition (CVD) or Physical Vapor Deposition (PVD) techniques. In some rare cases Plasma Assisted Chemical Vapor Deposition (PACVD) has also been practiced.

The CVD-technique is often preferred over PVD as it has several advantages. It allows larger coating batches, produces coatings with good coating thickness distribution on complex shaped inserts, has a high throwing power, can be used to deposit electrical non-conducting layers like $Al_2O_3$ and $ZrO_2$. Many different materials can be deposited in the same coating run like, e. g., $Al_2O_3$, TiC, $TiC_xN_y$, TiN, $TiC_xN_yO_z$, $ZrC_xN_y$ and $ZrO_2$.

The CVD technique is conducted at a rather high temperature range, from about 950 to about 1050° C. Due to this high deposition temperature and to a mismatch in thermal coefficient of expansion between the deposited coating materials and the cemented carbide tool insert, CVD produces coatings with cooling cracks and tensile stresses.

PVD processes run at a significantly lower temperature, from about 450 to about 650° C. and are performed under strong ion bombardment which leads to crack free layers with high compressive stresses. The high compressive stresses and the absence of cooling cracks make PVD coated tool inserts much tougher than CVD-coated tool inserts and are therefore often preferred in interrupted cutting operations like in milling.

A noticeable improvement in performance of CVD-coated tool inserts came about when the MTCVD (Moderate Temperature CVD)-technique begun to come into the tool industry about 5-10 years ago. An improvement in the toughness properties of the cutting tool insert was obtained. Today, the majority of tool producers use this technique. Unfortunately, the MTCVD technique is limited only to fabrication of $TiC_xN_y$-layers with x being greater than about 0.5, but less than about 0.7 and y being greater than about 0.3 but less than about 0.5 and x+y equal or close to 1. The deposition process here takes place at temperatures in the range from about 700 to about 930° C. It uses a gas mixture of $CH_3CN$, $TiCl_4$ and $H_2$. Today's modern coatings also include at least one layer of $Al_2O_3$ in order to achieve high crater wear resistance.

A further improvement in the toughness properties could be obtained when also the deposition temperature for the $\alpha$-$Al_2O_3$ process became possible as disclosed in patent application EP-A-1464727.

Post treatment of coated cutting inserts by brushing or by wet blasting is disclosed in several patents. The purpose is to achieve a smooth cutting edge and/or to expose the $Al_2O_3$ along the edge line as, e. g., disclosed in U.S. Pat. No. 5,851,687 and in EP 603 144 or to obtain the $Al_2O_3$ as the top layer also on the rake face in those cases when TiN is used as a wear detection layer at the flank face as disclosed in U.S. Pat. No. 5,861,210. Every treatment technique that exposes a surface like, e. g., a coating surface for an impact force such as does, e. g., wet- or dry blasting or ultra sonic shock waves, will have some influence on the stress state ($\sigma$) of the coating. However, to considerably relieve tensile stresses in all layers in a CVD-coating structure an intensive surface treatment is required. However, such a treatment may even lead to a too big change in the stress state, e. g., from highly tensile to highly compressive as is disclosed in U.S. Pat. No. 6,884,496, in which a dry blasting technique is used.

For the wet blasting technique, the blasting media, usually $Al_2O_3$ grits and water, have to strike the coating surface with a high impulse. The impact force can be controlled by, e. g., the blasting pulp pressure, the distance between blasting nozzle and coating surface, grain size of the blasting media, the concentration of the blasting media and the impact angle of the blasting jet.

Despite these progresses further improvements in toughness properties of CVD-coated tool inserts are very desirable.

OBJECTS AND SUMMARY OF THE INVENTION

It is an object of the present invention to provide CVD-coated tool inserts with improved toughness properties.

It is a further object of the present invention to provide a method of making CVD-coated tool inserts with improved toughness properties.

In one aspect of the invention, there is provided a CVD coated cutting tool insert of cemented carbide, cermet or ceramics comprising a body of generally polygonal or round shape having at least one rake face and at least one clearance face, said insert being at least partly coated with a from about 2 to about 10 μm thick coating including at least one layer of $TiC_xN_y$ and an $\alpha$-$Al_2O_3$-layer being the outer layer at least on the rake face wherein on said at least one rake face and said at least one clearance face the $TiC_xN_y$-layer has a thickness of from about 1 to about 8 μm where x≧0, y≧0 and x+y=1, and a tensile stress level of from about 10 to about 300 MPa and the $\alpha$-$Al_2O_3$-layer has a thickness of from about 1 to about 5 μm and is the outermost layer with an XRD-diffraction intensity ratio I(012)/I(024)≧1.5 and with a mean Ra value MRa<0.1 .mu.m as measured on ten randomly selected areas, 10×10 μm², by AFM-technique or on only said at least one rake face the $TiC_xN_y$-layer has a thickness of from about 1 to about 8 μm, where x≧0, y≧0 and x+y=1, and a tensile stress level of from about 10 to about 300 MPa and the $\alpha$-$Al_2O_3$-layer with a thickness of from about 1 to about 5 μm is the outermost layer with an XRD-diffraction intensity ratio I(012)/I(024)≧1.5 and a mean Ra value MRa<0.1 μm as measured on ten randomly selected areas, 10×10 μm², by AFM-technique and on said at least one clearance face the $TiC_xN_y$-layer has a tensile stress in the range from about 600 to about 1000 MPa and the $\alpha$-$Al_2O_3$-layer has an XRD-diffraction intensity ratio I(012)/I(024)<1.5.

In another aspect of the invention, there is provided a method of producing a CVD-coated cutting tool insert with a $TiC_xN_y$-layer and an $\alpha$-$Al_2O_3$-layer with a high surface smoothness and with low tensile stress level comprising subjecting said coating to a first intensive wet blasting operation with a slurry of F80 grits of $Al_2O_3$ in water at an air pressure of from about 1.8 to about 2.4 bar followed by a second blasting treatment with a slurry of F320 grits of $Al_2O_3$ in water with an air pressure of about 2 bar.

DETAILED DESCRIPTION OF THE PREFERRED EMBODIMENTS OF THE INVENTION

Figure 1:
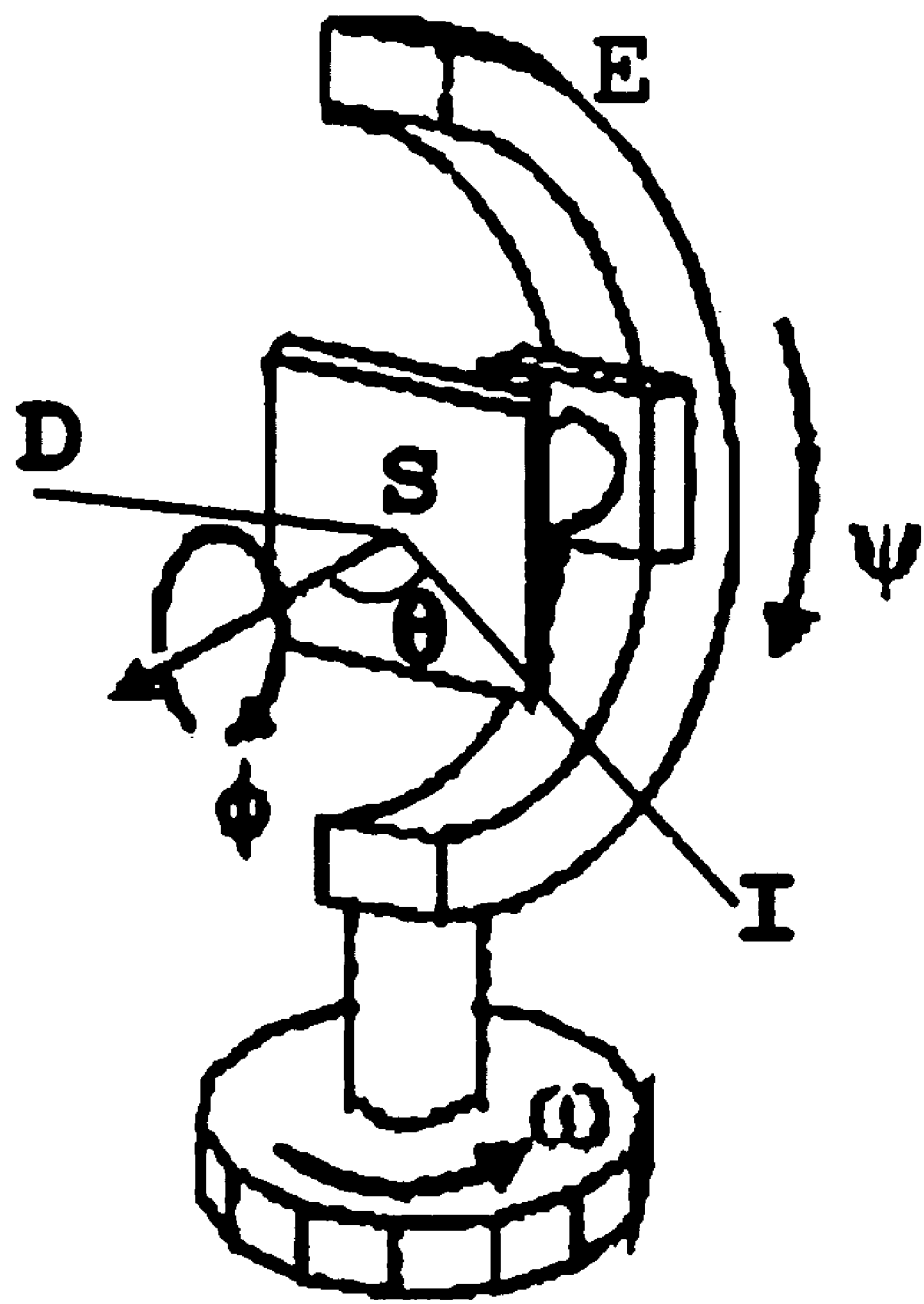
FIG. 1 shows a goniometer setup for the evaluation of residual stress by X-ray measurements in which E=Euler ¼-cradle
S=sample
I=incident X-ray beam
D=diffracted X-ray beam
θ=diffraction angle
ω=θ
ψ=tilt angle along the Euler ¼-cradle
Φ=rotation angle around the sample axis

The present invention thus relates to coated cutting tool inserts comprising a body of generally polygonal or round shape having at least one rake face and at least one clearance face comprising a coating and a substrate. The coating comprises at least one $TiC_xN_y$-layer and one well-crystalline layer consisting of 100% $\alpha$-$Al_2O_3$. One such $\alpha$-$Al_2O_3$ layer is the top visible layer at least on the rake face and along the cutting edge line and it has been intensively wet blasted or treated by any other similar technique capable of bombarding the coating surface with a sufficiently high energy to create tensile stress relaxation in both the $Al_2O_3$ and the $TiC_xN_y$-layers. The $Al_2O_3$ top layer has a very smooth surface.

It has surprisingly been discovered that a significant, improved toughness performance can be achieved if a coated cutting tool insert with a generally polygonal or round shape having at least one rake face and at least one clearance face, said insert being at least partly coated produced to possess the following features:

a penultimate $TiC_xN_y$ layer with a thickness of from about 1 to about 8 μm, preferably from about 2 to about 5 μm, where $x \geq 0$, $y \geq 0$ and $x+y=1$, preferably produced by MTCVD, with tensile stresses of from about 10 to about 300 MPa, preferably from about 10 to about 200 MPa and an outer $\alpha$-$Al_2O_3$-layer with a thickness of from about 1 to about 5 μm, preferably from about 2 to about 4 μm, being the top layer on the rake face and along the edge line having a mean roughness Ra<0.1 μm measured over a length of 10 μm by Atomic Force Microscopy (AFM) and an XRD-diffraction intensity (peak height minus background) ratio of I(012)/I(024)$\geq$1.5.

Preferably, there is a bonding layer of $TiC_xN_yOz$, $x \geq 0$, $z > 0$ and $y \geq 0$ between the $TiC_xN_y$-layer and the ($\alpha$-$Al_2O_3$-layer.

The total thickness of the two layers is less than or equal to about 10 μm, preferably less than or equal to about 6 μm.

Additional layers can be incorporated into the coating structure between the substrate and the layers according to the present invention composed of metal nitrides and/or carbides and/or oxides with the metal elements selected from Ti, Nb, Hf, V, Ta, Mo, Zr, Cr, W and Al to a total coating thickness of less than about 20 μm.

It is preferred to have low tensile stresses in the $TiC_xN_y$ layer since it was found that if compressive stresses were to be induced by blasting, very high blasting impact force was required and under such conditions flaking of the coating occurred along the cutting edge. It was also found that such induced compressive stresses were not as stable with respect to temperature increase, which occurs in a cutting operation as compared to if the coating has some tensile stresses still present.

The residual stress, σ, of the inner $TiC_xN_y$ layer is evaluated by XRD measurements using the well known $\sin^2\psi$ method as described by I. C. Noyan, J. B. Cohen, Residual Stress Measurement by Diffraction and Interpretation, Springer-Verlag, New York, 1987 (pp 117-130). The measurements shall be performed using $CuK_\alpha$-radiation on the $TiC_xN_y$ (422) reflection with a goniometer setup as shown in FIG. 1. The measurements shall be performed on an as flat surface as possible. It is recommended to use the side-inclination technique (ψ-geometry) with six to eleven ψ-angles, equidistant within a $\sin^2\psi$-range of 0 to 0.5 (ψ=45°). An equidistant distribution of Φ-angles within a Φ-sector of 90° is also preferred. To confirm a biaxial stress state the sample shall be rotated for Φ=0° and 90° while tilted in ψ. It is recommended to investigate possible presence of shear Istresses and therefore both negative and positive ψ-angles shall be measured. In the case of an Euler ¼-cradle this is accomplished by measuring the sample also at Φ=180° and 270° for the different ψ-angles. The $\sin^2\psi$ method is used to evaluate the residual stress preferably using some commercially available software such as DIFFRAC$^{Plus}$ Stress32 v. 1.04 from Bruker AXS with the constants Young's modulus, E=480 GPa and Poisson's ratio, ν=0.20 in case of an MT CVD Ti(C,N)—layer and locating the reflection using the Pseudo-Voigt-Fit function. In the case of the following parameters are used: E-modulus=480 GPa and Poisson's ratio ν=0.20. In case of a biaxial stress state the tensile stress is calculated as the average of the obtained biaxial stresses.

For the $\alpha$-$Al_2O_3$, it is in general not possible to use the $\sin^2\psi$ technique since the required high 2θ angle XRD-reflections are often too weak. However, the inventor has found a useful alternative measure that relates the state of the $\alpha$-$Al_2O_3$ to cutting performance.

For an $\alpha$-$Al_2O_3$ powder, the diffraction intensity ratio I(012)/I(024) is close to about 1.5. Powder Diffraction File JCPDS No 43-1484 states the intensities $I_0(012)=72$ and $I_0(024)=48$. The inventor has observed that for tensile stressed (σ about>350 MPa) CVD $\alpha$-$Al_2O_3$-layers on cemented carbide the intensity ratio I(012)/I(024) is surprisingly significantly less than the expected value 1.5, most often<1. This may be due to some disorder in the crystal lattice caused by the tensile stresses. It has been found that when such a layer is subjected to intense blasting (stress released) or if it has been completely removed from the substrate and powdered (unstressed) the ratio I(012)/I(024) becomes closer, equal or even higher than 1.5 dependent on the applied blasting force. Thus, this intensity ratio can be used as an important state feature of an $\alpha$-$Al_2O_3$ layer. A ratio higher than 1.5 may occur if a high blasting force is used together with the fact that for XRD-analyses of thin layers the low 2θ angle like the (012)-reflection the peak intensity I(012) will be overestimated in comparison to higher angle reflection e g the (024)-reflection if not a so called "thin film correction" calculation is done.

According to the method of the present invention, a cutting tool insert is provided with a CVD-coating comprising a penultimate $TiC_xN_y$-layer and an outer $\alpha$-$Al_2O_3$-layer. In order to obtain a high surface smoothness and low tensile stress level, the coating is subjected to a first intensive wet blasting operation on the rake face with a slurry of F80 grits (FEPA-standard) of $Al_2O_3$ in water at an air pressure of from about 1.8 to about 2.4 bar for about 2 to about 8 sec/insert followed by a second blasting treatment with a slurry of F320 grits (FEPA-standard) of $Al_2O_3$ in water with an air pressure of about 2 bar for about 4 to about 10 sec/insert. A freshly made up slurry of F80 grits and water before the use on production inserts should first be used on dummy inserts in order to slightly round off the grits.

If a smooth coating surface is desired also on the clearance face blasting has to be performed there as well. In this case the $TiC_xN_y$ layer will have low tensile stresses both on the rake face and at the clearance side. This is the preferred embodiment when cutting smearing materials like stainless steel or nodular cast iron.

If inserts are desired with a different color on the clearance side than on the black rake face an outermost thin from about 0.1 to about 2 μm coloring layer of TiN (yellow), $TiC_xN_y$ (grey or bronze) or TiC (grey) is deposited. The inserts are then blasted with the 90° spray angle removing the top layer exposing the black $Al_2O_3$ layer. In this case the coating on the rake face will have the low desired tensile stress while the clearance side will have high tensile stresses in the range from about 600 to about 1000 MPa dependent on the choice of coating and the coefficient of Thermal Expansion (CTE) of the used cemented carbide insert.

The invention is additionally illustrated in connection with the following examples, which are to be considered as illustrative of the present invention. It should be understood, however, that the invention is not limited to the specific details of the examples.

EXAMPLE 1

A) Cemented carbide cutting inserts in style R390-11T308M-PM with the composition 12.6 weight-% Co, 1.25 wt % TaC, 0.32 wt % NbC and balance WC (CTE=about $6*10^{-6}$) were coated with a 0.5 μm thick layer of TiN using conventional CVD-technique at 930° C. followed by a 2 μm $TiC_xN_y$ layer employing the MTCVD-technique using $TiCl_4$, $H_2$, $N_2$ and $CH_3CN$ as process gases at a temperature of 885° C. In subsequent process steps during the same coating cycle, a layer of $TiC_xO_z$ about 0.5 μm thick was deposited at 1000° C. using $TiCl_4$, CO and $H_2$, and then the reactor was flushed with a mixture of 2% $CO_2$, 5% HCl and 93% $H_2$ for 2 min before a 2.2 μm thick layer of $\alpha$-$Al_2O_3$ was deposited. The process conditions during the deposition steps were as below:

| Step | TiN | $TiC_xN_y$ | $TiC_xO_z$ | Flush | $Al_2O_3$ |
|---|---|---|---|---|---|
| $TiCl_4$ | 1.5% | 1.4% | 2% | | |
| $N_2$ | 38% | 38% | | | |
| $CO_2$: | | | | 2% | 4% |
| CO | | | 6% | | |
| $AlCl_3$: | | | | | 3.2% |
| $H_2S$ | — | | | | 0.3% |
| HCl | | 1% | | 5% | 3.2% |

| Step | TiN | $TiC_xN_y$ | $TiC_xO_z$ | Flush | $Al_2O_3$ |
|---|---|---|---|---|---|
| $H_2$: | balance | balance | balance | balance | balance |
| $CH_3CN$ | — | 0.6% | | | |
| Pressure: | 160 mbar | 60 mbar | 60 mbar | 60 mbar | 70 mbar |
| Temperature: | 930° C. | 885° C. | 1000° C. | 1000° C. | 1000° C. |
| Duration: | 30 min | 1 h | 20 min | 2 min | 2 h |

XRD-analysis of the deposited $Al_2O_3$ layer showed that it consisted only of the $\alpha$-phase.

EXAMPLE 2

Example 1 was repeated but the process time for $TiC_xN_y$-step was 1.5 h and process time for $Al_2O_3$-step was 4 hours. A coating of about 3 μm $TiC_xN_y$ and 4.5 μm $\alpha$-$Al_2O_3$ was obtained.

EXAMPLE 3

Example 1 was repeated but the process time for $Al_2O_3$-step was 6 hours. A coating of about 2 μm $TiC_xN_y$ and 6.5 m $\alpha$-$Al_2O_3$ was obtained.

EXAMPLE 4

Coated inserts from examples 1, 2 and 3 were post treated by wet blasting (both sides) and edge brushing under different conditions. Blasting was performed in two steps. First with a slurry containing $Al_2O_3$-grits (grain size F80, FEPA-standard) and water and then in a second step with $Al_2O_3$ grits (grain size F320, FEPA-standard). The aim of these steps was to reduce the tensile stress level and to produce the high coating smoothness. Four different blasting pressures 1.8, 2.0, 2.2 and 2.4 bar and two different spray angles 45° and 90° were used in step 1. In step 2 only 2 bars pressure and 90° spray angle was used. Some inserts were also brushed with a nylon brush containing SiC grains in order to smooth the coating surface along and near the cutting edge. The coatings of the different post-treated inserts were examined in a Scanning Microscope (SEM) at high magnification. It was evident from the examination that only some inserts from example 1 blasted at 2.4 bar showed sporadic flaking of the coating at the cutting edges. The inserts blasted at 90° angle showed a slightly better surface smoothness than the 45° angle blasted ones.

The smoothness of the coating surface expressed as a well known roughness value Ra was measured by AFM on an equipment from Surface Imaging System AG (SIS) on all inserts except for the brushed and the nonblasted ones. The roughness was measured on ten randomly selected plane surface areas (10μm×10 μm). The mean value from these ten Ra values was used as the roughness value here named mean Ra (MRa) in table 1 below.

X-ray Diffraction Analysis using a Bragg-Brentano diffractometer, Siemens D5000, was used to determine the I(012)/I(024)-ratio using Cu K$\alpha$-radiation. The residual stress was evaluated using $\psi$-geometry on an X-ray diffractometer Bruker D8 Discover-GADDS equipped with laser-video positioning, Euler ¼-cradle, rotating anode as X-ray source (CuK$_\alpha$-radiation) and an area detector (Hi-star). A collimator of size 0.5 mm was used to focus the beam. The analysis was performed on the $TiC_xN_y$ (422) reflection using the goniometer settings 2θ=126°, ω=63° and Φ=0°, 90°, 180°, 270°. Eight ψ tilts between 0° and 70° were performed for each Φ-angle. The $\sin^2\psi$ method was used to evaluate the residual stress using the software DIFFRAC$^{Plus}$ Stress32 v. 1.04 from Bruker AXS with the constants Young's modulus, E=480 GPa and Poisson's ratio, v=0.20 and locating the reflection using the Pseudo-Voigt-Fit function. A biaxial stress state was confirmed and the average value was used as the residual stress value.

EXAMPLE 5

Inserts with the different post-treatments were tested in two different milling cutting operations, both very demanding on toughness properties. The following conditions were used:

Cutting test 1:

A milling operation in an alloyed steel SS2541 was performed. The work-piece was a rectangular block. The milling cutter entered the work-piece a number of times from its long side, conditions classified as a "difficult entrance".

| Dry condition | |
|---|---|
| Cutting speed | V = 200 m/min |
| Feed per tooth | Fz = 0.17 mm/Z |
| Axial depth of cut | Ap = 3 mm |
| Radial depth of cut | Ae = 16 mm |
| Number of teeth = | 1 |

Three inserts (one edge/insert) were run over the work-piece. The lifetime expressed as number of entrances that could be completed before breakage of the edge occurred is given in table 1 below.

Cutting test 2:

A milling operation in an alloyed steel SS2244 was performed. The shape of the work-piece was a thin long bar with a thickness much smaller than the diameter of the milling cutter. The milling cutter passed the bar longitudinally, conditions classified as a "difficult exit".

| Wet condition | |
|---|---|
| Cutting speed | V = 150 m/min |
| Feed per tooth | Fz = 0.15 mm/Z |
| Axial depth of cut | Ap = 3 mm |
| Radial depth of cut | Ae = 7 mm |
| Number of teeth = | 2 |

3×2 inserts (one edge/insert) were run over the work-piece. The lifetime expressed as number of bars that could be completed before breakage of the edges occurred is given in the table below.

| =Variant | Pressure/ Blasting angle step 1 | Mean Ra-Value MRa | Test 1 mean lifetime | Test 2 Mean lifetime | I(012)/ I(024) $Al_2O_3$ Layer | Stress in $TiC_xN_y$ Layer |
|---|---|---|---|---|---|---|
| A | Non | >>0.09 | 2 | <1 | 0.8 | 700 MPa |
| B | Brushed | — | 6 | 5 | 0.9 | 610 MPa |
| C | 1.8 bar/45° | 0.11 | 11 | 5 | 1.2 | 450 MPa |
| D | 2.0 bar/45° | 0.10 | 14 | 11 | 1.3 | 410 MPa |
| E | 1.8 bar/90° | 0.09 | 24 | 17 | 1.5 | 265 MPa |
| F | 2.0 bar/90° | 0.09 | 24 | 19 | 1.8 | 160 MPa |
| G | 2.2 bar/90° | 0.06 | 27 | 22 | 1.9 | 50 MPa |
| H | 2.4 bar/90° | 0.07 | 27 | 23 | 2.2 | 10 MPa |

-continued

| =Variant | Pressure/ Blasting angle step 1 | Mean Ra-Value MRa | Test 1 mean lifetime | Test 2 Mean lifetime | I(012)/ I(024) $Al_2O_3$ Layer | Stress in $TiC_xN_y$ Layer |
|---|---|---|---|---|---|---|
| I | 2.2 bar/90° | 0.09 | 18 | 13 | 1.8 | 280 MPa |
| J | 2.4 bar/90° | 0.08 | 10 | 7 | 2.0 | 390 MPa |

A-H) 2.5 μm (TiN + $TiC_xN_y$) + 0.5 μm $TiC_xO_y$ + 2.2 μm $\alpha$-$Al_2O_3$
I) 3.5 μm (TiN + $TiC_xN_y$) + 0.5 μm $TiC_xO_y$ + 4.5 μm $\alpha$-$Al_2O_3$
J) 2.5 μm (TiN + $TiC_xN_y$) + 0.5 μm $TiC_xO_y$ + 6.6 μm $\alpha$-$Al_2O_3$ The results from the cutting tests clearly show that the best toughness performance is achieved with the variants E, F, G and H which have the lowest tensile stresses in the $TiC_xN_y$ layer, the highest I(012)/I(024) ratio of the $Al_2O_3$-layer and low mean Ra-values. Variant I with a total coating thickness of 8.5 μm does not show as good performance (but still satisfactory) as the corresponding thinner, 5.2 μm, variant G. Also variant J with a thick $Al_2O_3$ layer shows a lower performance. Here the stress in the $TiC_xN_y$-layer is higher 390 MPa. These facts show that there exists a certain parameter space of properties, which is directly connected to the lifetime of cutting tool insert. Consequently a number of conditions and features have to be present simultaneously in order to achieve the high performance of the cutting tool insert.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. A CVD coated cutting tool insert of cemented carbide, cermet or ceramics comprising a body of generally polygonal or round shape having at least one rake face and at least one clearance face, said insert being at least partly coated with a from about 2 to about 10 μm thick coating including at least one layer of $TiC_xN_y$ and an $\alpha$-$Al_2O_3$-layer being the outer layer at least on the rake face
   wherein
   (a) on said at least one rake face and said at least one clearance face
   the $TiC_xN_y$-layer has a thickness of from about 1 to about 8 μm where x≧0, y≧0 and x+y=1, and a tensile stress level of from about 10 to about 300 MPa and
   the $\alpha$-$Al_2O_3$-layer has a thickness of from about 1 to about 5 μm and is the outermost layer with an XRD-diffraction intensity ratio I(012)/I(024)≧1.5 and with a mean Ra value MRa<0.1 μm as measured on ten randomly selected areas, 10×10 μm², by AFM-technique
   or
   (b) on only said at least one rake face
   the $TiC_xN_y$-layer has a thickness of from about 1 to about 8 μm, where x≧0, y≧0 and x+y=1, and a tensile stress level of from about 10 to about 300 MPa and
   the $\alpha$-$Al_2O_3$-layer with a thickness of from about 1 to about 5 μm is the outermost layer with an XRD-diffraction intensity ratio I(012)/I(024)≧1.5 and a mean Ra value MRa<0.1 μm as measured on ten randomly selected areas, 10×10 μm², by AFM-technique
   and
   (c) on said at least one clearance face
   the $TiC_xN_y$-layer has a tensile stress in the range from about 600 to about 1000 MPa and the α-Al$_2$O$_3$-layer has an XRD-diffraction intensity ratio I(012)/I(024)<1.5.

2. A cutting tool insert of claim 1 wherein there is a thin from about 0.1 to about 1 μm TiC$_x$N$_y$O$_z$, where x≧0, z>0 and y≧0, bonding layer on top of the TiC$_x$N$_y$ layer.

3. A cutting tool insert of claim 1 wherein the cemented carbide has a Coefficient of Thermal Expansion of ≧5.5*10$^{-6}$ m/K.

4. A cutting tool insert of claim 1 wherein the at least one layer of TiC$_x$N$_y$ is deposited by MTCVD.

5. A cutting tool insert of claim 1 wherein the TiC$_x$N$_y$-layer has a thickness of from about 2 to about 5 μm and the α-Al$_2$O$_3$-layer has a thickness of from about 2 to about 4 μm.

6. A cutting tool insert of claim 1 wherein the α-Al$_2$O$_3$-layers are covered with a thin layer from about 0.1 to about 2 μm, of TiN, TiC$_x$N$_y$ or TiC giving the insert a different color.

7. A cutting tool insert of claim 1 wherein the TiC$_x$N$_y$-layer is the penultimate layer of the coating.

* * * * *